(12) United States Patent
Hamada

(10) Patent No.: US 7,835,069 B2
(45) Date of Patent: Nov. 16, 2010

(54) WDM OPTICAL AMPLIFIER WITH HEAT RADIATION FROM LASER SOURCE TO AMPLIFICATION MEDIUM

(75) Inventor: Satoshi Hamada, Tokyo (JP)

(73) Assignee: NEC Corporation, Tokyo (JP)

( * ) Notice: Subject to any disclaimer, the term of this patent is extended or adjusted under 35 U.S.C. 154(b) by 246 days.

(21) Appl. No.: 12/058,196

(22) Filed: Mar. 28, 2008

(65) Prior Publication Data
US 2008/0239468 A1 Oct. 2, 2008

(30) Foreign Application Priority Data
Mar. 28, 2007 (JP) ............................. 2007-083959

(51) Int. Cl.
*H04B 10/17* (2006.01)
*H04B 10/12* (2006.01)
(52) U.S. Cl. .................................... 359/341.3; 359/337
(58) Field of Classification Search .................. 359/337, 359/341.3
See application file for complete search history.

(56) References Cited

U.S. PATENT DOCUMENTS

| 5,446,750 | A * | 8/1995 | Ohtsuka et al. ................ 372/34 |
| 6,567,600 | B2 * | 5/2003 | Yoshida ....................... 385/134 |
| 6,621,623 | B1 * | 9/2003 | Okuno ....................... 359/341.1 |
| 6,704,137 | B2 * | 3/2004 | Hamada ................... 359/341.3 |
| 6,857,276 | B2 * | 2/2005 | Finn et al. ...................... 62/3.7 |
| 7,027,216 | B1 * | 4/2006 | Harris ....................... 359/337.5 |
| 7,130,110 | B2 * | 10/2006 | Krizan et al. ................ 359/337 |
| 7,585,117 | B2 * | 9/2009 | Kaneko et al. ................ 385/88 |
| 7,626,755 | B2 * | 12/2009 | Furuya et al. ............... 359/326 |
| 2005/0018950 | A1* | 1/2005 | Arellano ...................... 385/14 |
| 2005/0038487 | A1* | 2/2005 | Stoltz .......................... 607/88 |
| 2008/0187268 | A1* | 8/2008 | Kaneko et al. ................ 385/27 |

FOREIGN PATENT DOCUMENTS

| JP | 08173560 A | | 7/1996 |
| JP | 2001007428 A | | 1/2001 |
| JP | 2003161846 A | * | 6/2003 |
| JP | 2005202832 A | * | 7/2005 |

* cited by examiner

*Primary Examiner*—Eric Bolda

(57) ABSTRACT

An optical direct amplifier lowers the power consumption with a simple structure at a low cost. This amplifier includes an optical amplification medium (e.g., optical fiber) that carries out an optical amplification function in response to optical excitation by an exciting light source (e.g., semiconductor laser); a temperature controller for controlling the temperature of the amplification medium; a heat radiating member for radiating the heat generated by the light source; and a heat transmission regulator (e.g., Peltier module) for allowing the heat to flow into the amplification medium from the light source and for preventing the heat from flowing into the light source from the amplification medium. The amplification medium is heated by application of the heat generated by the light source by way of the heat radiating member and the heat transmission regulator.

8 Claims, 4 Drawing Sheets

US 7,835,069 B2

WDM OPTICAL AMPLIFIER WITH HEAT RADIATION FROM LASER SOURCE TO AMPLIFICATION MEDIUM

This application is based upon and claims the benefit of priority from Japanese patent application No. 2007-083959 filed on Mar. 28, 2007, the disclosure of which is incorporated herein in its entirety by reference.

BACKGROUND OF THE INVENTION

1. Field of the Invention

The present invention relates to an optical direct amplifier and more particularly, to an optical direct amplifier preferably used for Wavelength Division Multiplexing (WDM) optical transmission.

2. Description of the Related Art

In recent years, with the WDM optical transmission system, electric power consumption has been increasing due to the performance enhancement of optical components or devices such as optical cross connects, the speedup in the operation of optical transmitters/receivers for aiming at realization of the transmission of optical signals at 40 Gbit/s, and so on. For this reason, there is an anxiety that power consumption of the individual optical devices used in the WDM optical transmission system is excessively large. Moreover, there has been the demand of power consumption lowering that includes the consideration for environmental measures as well. In this way, the importance of power consumption lowering has been rising more and more in the WDM optical transmission system.

When an optical signal is transmitted with an optical direct amplifier in the WDM optical transmission system using optical repeaters, there is a possibility that the transmission characteristics deteriorates (i.e., digital errors occur) due to gain deviation within the amplification band of the optical direct amplifier used. This is because the wavelength characteristic of the gain of a rare-earth-doped optical fiber, which is used as an optical amplification medium of the optical direct amplifier, has temperature dependence, and the said temperature dependence of the gain is increased by the ambient temperature change, resulting in the transmission characteristics deterioration. Accordingly, there is the need that the optical amplification medium needs to be kept at a temperature higher than its permissible temperature range to avoid the gain deviation among the channels that is induced by the wavelength characteristic change of the gain. To fulfill this need, conventionally, an optical direct amplifier shown in FIG. 1 has been used.

FIG. 1 is a perspective view of a prior-art optical direct amplifier 110 having a conventional typical structure, showing schematically the structure of the amplifier 110. With this amplifier 110, an optical amplification medium 111 is heated by a heating medium 112 mounted on one side of the amplifier 110.

The optical amplification medium 111 is formed by a reel 111a and an optical fiber 111b for amplification placed around the reel 111a. A temperature sensor 113 is mounted in the vicinity of the optical fiber 111b. A heating medium 112 is an electric heater that generates heat responsive to the supply of electric power. A temperature controller circuit 114 is electrically connected to the heating medium 112 and the optical amplification medium 111 by way of cables 116 and 117, respectively. The temperature controller circuit 114, which monitors the temperature of the optical amplification medium 111 at all times, controls the heating medium 112 in such a way that the temperature of the optical amplification medium 111 is kept at a predetermined temperature higher than the ambient temperature.

Since the prior-art optical direct amplifier 110 has the above-described structure, the temperature of the optical amplification medium 111 (i.e., the optical fiber 111b) whose gain has temperature dependence can be kept constant. Therefore, the effect by the temperature deviation of the gain of the optical fiber 111b is suppressed and as a result, stable WDM optical transmission characteristics that are not affected by the ambient temperature can be obtained. In other words, the temperature dependence of the gain-wavelength characteristics of the optical amplification medium 111 can be suppressed, thereby generating the gain-wavelength characteristics regardless of the ambient temperature.

In addition, the heating medium 112 is provided on only one side of the optical amplification medium 111 (i.e., the reel 111a) in the structure of FIG. 1. However, the heating medium 112 may be provided on each side of the optical amplification medium 111 (i.e., the reel 111a) in the structure of FIG. 1.

The followings are other related art to the present invention than the above-described prior-art optical direct amplifier 110.

The Patent Document 1 (the Japanese Non-Examined Patent Publication No. 2001-7428) published in 2001 discloses an optical amplifier that makes it possible to maintain the gain flatness easily. This optical amplifier is used for WDM optical transmission system.

The optical amplifier of the Patent Document 1 comprises an optical waveguide for optically amplifying a signal light, to which a fluorescent material that can be excited by excitation light is doped (e.g., an optical fiber for amplification to which a fluorescent material is doped); and exciting means for supplying excitation light to the optical waveguide. This optical amplifier further comprises output controlling means for controlling the output in such a way that the power of signal light outputted from the optical waveguide is kept at a target value, and temperature controlling means for controlling the temperature of at least part of the optical waveguide based on the power of the signal light inputted into the optical waveguide.

Concretely speaking, the optical fiber for amplification is placed around a coil bobbin made of a material having excellent thermal conductivity (e.g., aluminum). A Peltier element for adjusting the temperature of the optical fiber and a thermistor for detecting the temperature of the optical fiber are adhered to the coil bobbin. For this reason, if the power of the output signal light seeks to change in accordance with the fluctuation of the power of the inputted signal light, the temperature of the optical fiber is controlled in such a way that the power of the output signal light is kept at the target value. Therefore, the degradation of the optical amplification performance is suppressed even if the power of the inputted signal light fluctuates. As a result, the flatness of gain can be maintained easily. (See claim 1, FIG. 1, and paragraphs 0018 to 0022 of the Patent Document 1.)

The Patent Document 2 (the Japanese Non-Examined Patent Publication No. 8-173560) published in 1996 discloses a laser therapy instrument and a probe used therefor, which make it possible to conduct a laser therapy and a thermotherapy simultaneously for chronic pain treatment without causing any thermal damage to the semiconductor laser.

The probe for the laser therapy instrument disclosed by the Patent Document 2 comprises a semiconductor laser, a thermo-module (e.g., Peltier element) for cooling the semiconductor laser, a thermistor for detecting the temperature of the thermo-module, touch-sensor electrodes for detecting the contact with a human body, a ceramic that emits far-infrared rays, and a probe case for enclosing these components. The thermo-module has an opening at its central position, into which the irradiation mouth of the semiconductor laser is inserted. The heat radiating plate of the semiconductor laser is fixed on the cooling side of the thermo-module. The ceramic for emitting far-infrared rays is fixed on the opposite heating side of the thermo-module. When used, the ceramic is contacted with a human body to conduct a thermotherapy. Because of such the structure as above, the semiconductor laser can be cooled forcibly and therefore, reliability and endurance are enhanced. (See FIG. 1 and paragraphs 0005, 0009, and 0014 to 0015 of the Patent Document 2.)

With the prior-art optical direct amplifier 110 shown in FIG. 1, however, electric power is necessary not only for driving the exciting light source to be used for exciting the optical amplification medium 111 (i.e., the optical fiber 111*b* for amplification), for temperature-adjusting the said exciting light source, and for driving a control circuit that controls them but also for driving the heating medium 112. Accordingly, there is a demand that the power consumption of the prior-art optical direct amplifier 110 is lowered with a simple structure at a low cost.

SUMMARY OF THE INVENTION

The present invention was created to fulfill the above-described demand and its object is to provide an optical direct amplifier that makes it possible to lower the power consumption with a simple structure at a low cost.

The above object together with others not specifically mentioned will become clear to those skilled in the art from the following description.

An optical direct amplifier according to the present invention comprises:

an exciting light source for optical excitation;

an optical amplification medium that carries out an optical amplification function in response to optical excitation by the exciting light source;

a temperature controller for controlling a temperature of the optical amplification medium;

a heat radiating member for radiating heat generated by the exciting light source; and a heat transmission regulator, provided between the optical amplification medium and the heat radiating member, for allowing heat to flow into the optical amplification medium from the exciting light source and for preventing heat from flowing into the exciting light source from the optical amplification medium;

wherein the optical amplification medium is heated by application of heat generated by the exciting light source by way of the heat radiating member and the heat transmission regulator.

With the optical direct amplifier according to the present invention, the heat generated by the exciting light source, which is used for optically exciting the optical amplification medium, is conveyed to the heat radiating member and thereafter, it is dissipated or radiated to the outside of the said optical direct amplifier. Moreover, the heat transmission regulator for allowing the heat to flow into the optical amplification medium from the exciting light source and for preventing the heat from flowing into the exciting light source from the optical amplification medium is provided between the optical amplification medium and the heat radiating member. Thus, the optical amplification medium is heated by application of the heat generated by the exciting light source by way of the heat radiating member and the heat transmission regulator.

Therefore, the temperature of the optical amplification medium can be raised utilizing the heat generated by the exciting light source to thereby maintain the optical amplification medium at a predetermined temperature higher than an ambient temperature. As a result, the electric power required for heating the optical amplification medium can be made unnecessary and thus, the power consumption of the said optical direct amplifier can be lowered accordingly.

Moreover, it is sufficient for the invention to provide the heat radiating member and the heat transmission regulator in addition to the optical amplification medium, the exciting light source, and the temperature controller that are included in the prior-art optical direct amplifier. Furthermore, the heat radiating member can be easily realized with a rigid member having a good thermal conductivity, and the heat transmission regulator can be easily realized by, for example, a thermoelectric effect element. This means that the structure of the said optical direct amplifier is simplified and realized at a low cost.

Since the above-described structure is incorporated into the optical direct amplifier according to the present invention, it is apparent that this amplifier is different from the combination of the prior-art optical direct amplifier disclosed by the Patent Document 1 and the laser therapy instrument disclosed by the Patent Document 2.

In the optical direct amplifier according to the present invention, for example, a thermoelectric effect may be preferably used as the heat transmission regulator. However, any element or device may be used for this purpose if it has a function of preventing heat from flowing into the exciting light source from the optical amplification medium.

The optical direct amplifier according to the present invention is preferably used for the WDM optical transmission. However, this amplifier may be used for any other type of optical transmission than the WDM optical transmission, if it requires an optical amplification medium that carries out an optical amplification function in response to optical excitation by an exciting light source, and a temperature controller for controlling the temperature of the optical amplification medium, wherein the optical amplification medium needs to be heated.

In a preferred embodiment of the amplifier according to the invention, the exciting light source is fixed to a surface of the heat radiating member, and the optical amplification medium is fixed to another surface of the heat radiating member by way of the heat transmission regulator. In this embodiment, there is an additional advantage that the structure of the said amplifier is simplified furthermore.

In another preferred embodiment of the amplifier according to the invention, a thermoelectric effect element is used as the heat transmission regulator. In this embodiment, there is an additional advantage that the heat transmission regulator can be realized with a simple and low-cost structure.

In still another preferred embodiment of the amplifier according to the invention, the thermoelectric effect element is formed to be plate-shaped, and one surface of the thermoelectric effect element is in close contact with the heat radiating member while another surface of the thermoelectric effect element is in close contact with the optical amplification medium. In this embodiment, there is an additional advantage that the heat is efficiently transmitted from the heat radiating member to the optical amplification medium by way of the heat transmission regulator.

In a further preferred embodiment of the amplifier according to the invention, a heater for heating the optical amplification medium is additionally provided. In this embodiment, there is an additional advantage that the said optical direct amplifier can be used even if it is difficult to maintain the optical amplification medium at a predetermined temperature higher than an ambient temperature utilizing the heat generated by the exciting light source due to such a reason as the ambient temperature being extremely low.

In a still further preferred embodiment of the amplifier according to the invention, the optical amplification medium is formed by an optical fiber. In this embodiment, there is an additional advantage that the advantages of the invention are exhibited prominently.

In a still further preferred embodiment of the amplifier according to the invention, the temperature controller is configured in such a way as to maintain the temperature of the optical amplification medium at a predetermined temperature higher than an ambient temperature. In this embodiment, there is an additional advantage that the advantages of the invention are exhibited prominently.

In a still further preferred embodiment of the amplifier according to the invention, the said amplifier is configured for WDM optical transmission. In this embodiment, there is an additional advantage that the advantages of the invention are exhibited prominently.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
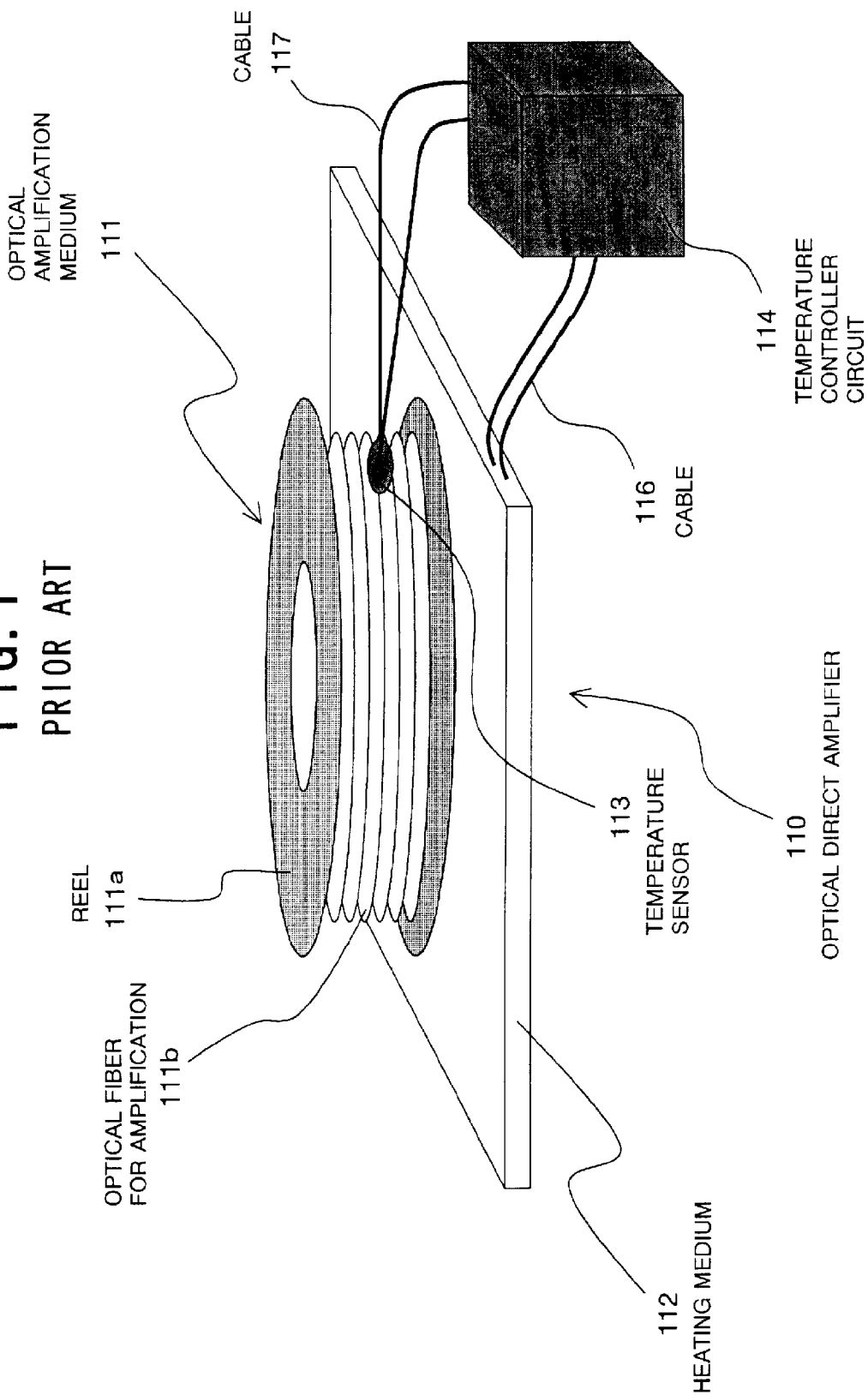
FIG. 1 is a perspective view showing schematically the structure of a prior-art optical direct amplifier.

Preferred embodiments of the present invention will be described in detail below while referring to the drawings attached.

First Embodiment

Figure 2:
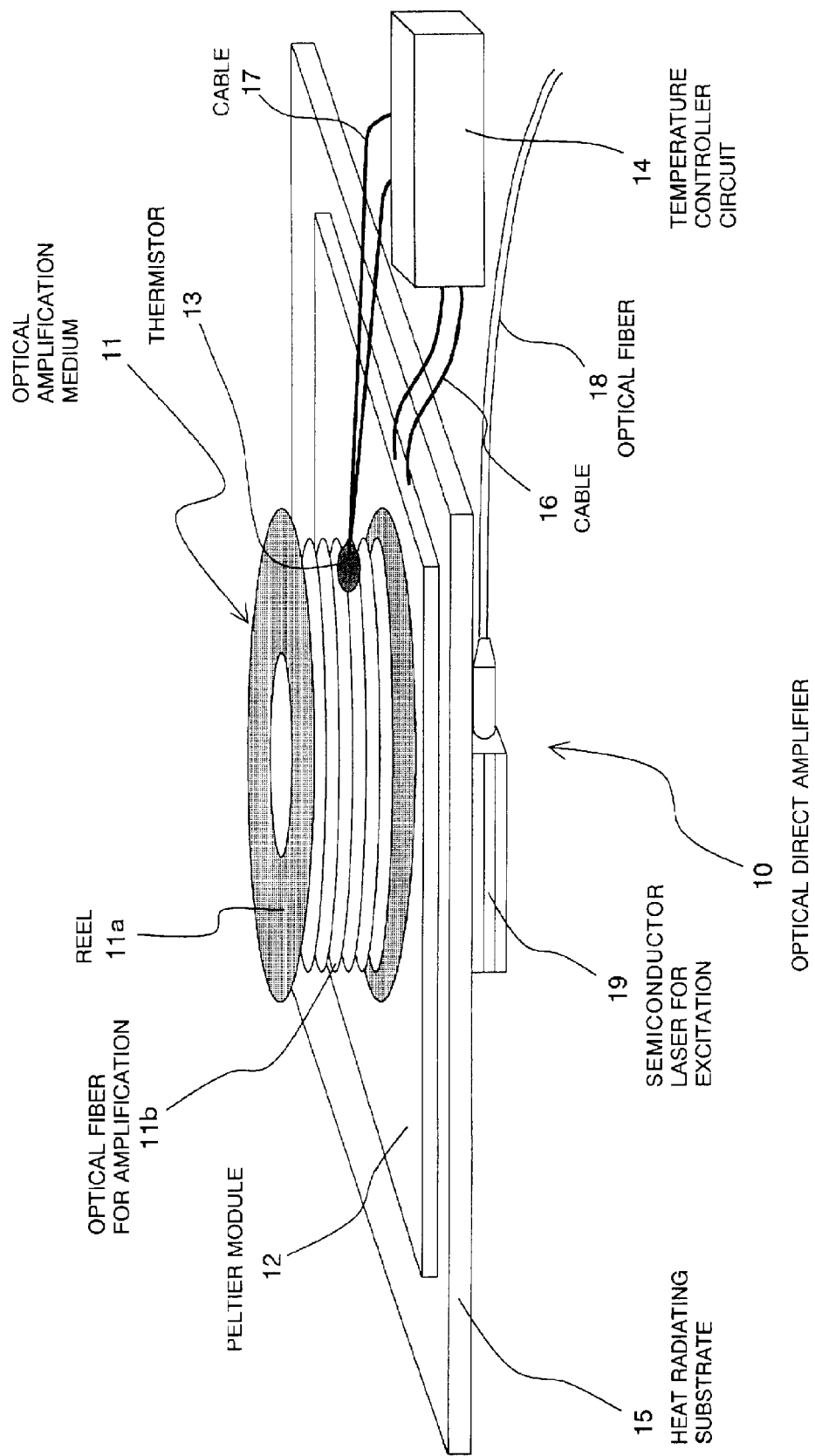
FIG. 2 is a perspective view showing schematically the structure of an optical direct amplifier according to a first embodiment of the invention.

As shown in FIG. 2, an optical direct amplifier 10 according to a first embodiment comprises an optical amplification medium 11 that carries out an optical amplification function in response to optical excitation by a semiconductor laser 19 for excitation (i.e., an exciting light source), and a temperature controller circuit 14 for controlling the temperature of the amplification medium 11. This point is the same as that of the prior-art optical direct amplifier 110 described previously with reference to FIG. 1.

However, unlike the prior-art optical direct amplifier 110, the direct amplifier 10 further comprises a heat radiating substrate (i.e., a heat radiating member) 15 for radiating the heat generated by the semiconductor laser 19, and a Peltier module 12 (which is a thermoelectric effect element) for preventing the heat from flowing into the laser 19 from the amplification medium 11, where the Peltier module 12 is provided between the amplification medium 11 and the heat radiating substrate 15. The Peltier module 12 serves as a heat transmission regulator for allowing the heat to flow into the amplification medium 11 from the semiconductor laser 19 and for preventing the heat from flowing into the laser 19 from the medium 11. The amplification medium 11 is configured in such a way as to be heated by the heat generated by the semiconductor laser 19 by way of the heat radiating substrate 15 and the Peltier module 12. In other words, the electric power emitted as the heat from the semiconductor laser 19 and the electric power emitted as the heat from a temperature regulator element (not shown) that performs the temperature regulation of the laser 19 are conveyed to the amplification medium 11 by way of the Peltier module 12 and the heat radiating substrate 15.

Here, the amplification medium 11 is formed by an approximately cylindrical reel 11a made of, for example, aluminum, and an Erbium-Doped optical Fiber (EDF) 11b for amplification placed around the reel 11a several times. However, an optical fiber for amplification that is doped with any other rare-earth element may be used. Any other type of an optical fiber may be used if it carries out an optical amplification function in response to optical excitation by an exciting light source. Any optical amplification medium having any other structure and/or form than an optical fiber may be used for this purpose.

The heat radiating substrate 15 is a rectangular plate made of a rigid material with good thermal conductivity, for example, stainless steel.

The Peltier module 12 has a rectangular plate- or sheet-like shape smaller than the heat radiating substrate 15. One surface of the module 12 is fixed to one flat surface of the heat radiating substrate 15 opposite to the module 12. This is to ensure the good thermal conductivity between the heat radiating substrate 15 and the amplification medium 11 and to reduce the bulk of the optical direct amplifier 10 for space saving. To ensure the good thermal conductivity between the heat radiating substrate 15 and the Peltier module 12, the whole surface of the Peltier module 12 located on the side of the heat radiating substrate 15 is close contact with the opposite surface of the substrate 15. The whole surface of the Peltier module 12 located on the opposite side of the heat radiating substrate 15 is fixed to and in close contact with one surface of the brim-shaped part of the reel 11a of the amplification medium 11. This is to ensure the good thermal conductivity between the amplification medium 11 and the Peltier module 12.

The semiconductor laser 19, which is provided for exciting the amplification medium 11 (i.e., the optical fiber 11b), is chip-shaped. One surface of the laser 19 is fixed to and in close contact with the opposite surface of the heat radiating substrate 15 to the Peltier module 12. This is to ensure the good thermal conductivity between the semiconductor laser 19 and the heat radiating substrate 15, thereby causing the heat emitted from the laser 19 during its operation to be conveyed efficiently to the heat radiating substrate 15.

The Peltier module 12 transfers the heat emitted from the semiconductor laser 19 to the amplification medium 11; however, the module 12 does not perform the heat transfer along the opposite direction thereto. This means that the Peltier module 12 is a device that makes it possible to allow the one-way thermal conduction only. The module 12 allows the heat to flow into the amplification medium 11 from the semiconductor laser 19 and at the same time, prevents the heat from flowing into the laser 19 from the amplification medium 11. Therefore, the situation in which the heat emitted from the amplification medium 11 is applied to the laser 19 and as a result, the laser 19 fail to function normally is surely avoided. Such the one-way thermal conduction as described here can be easily realized by, for example, placing the heat generating side of the Peltier module 12 on the side of the laser 19 and the heat absorbing side of the module 12 on the side of the amplification medium 11.

A thermistor 13, which serves as a temperature sensor, is mounted on the outer surface of the amplification medium 11 (i.e., the optical fiber 11b for amplification placed around the reel 11a). The thermistor 13 is electrically connected to a temperature controller circuit 14 by way of cables 17. The Peltier module 12 is also electrically connected to the said circuit 14 by way of cables 16.

The temperature controller circuit 14 monitors the temperature of the amplification medium 11 (i.e., the optical fiber 11b) at all times with the thermistor 13. Moreover, this circuit 14 controls or adjusts the electric current supplied to the Peltier module 12 in such a way that the electrical resistance of the thermistor 13 is kept constant, thereby controlling the temperature of the amplification medium 11. In this way, the temperature of the amplification medium 11 is kept at a predetermined temperature (i.e., a chosen temperature). This predetermined chosen temperature is higher than the highest temperature of the permissible range of the ambient temperature in which the amplification medium 11 is mountable.

To keep the amplification medium 11 at the chosen temperature, application of heat is required. Thus, the heat emitted from the semiconductor laser 19 for exciting the said medium 11 during its operation is utilized. For this reason, the heating medium (heater) 112 provided in the previously explained prior-art optical direct amplifier 110 with reference to FIG. 1 is not included.

Because of such the structure as explained above, the heat emitted from the semiconductor laser 19 during operation, which was thrown away in the atmosphere in the past, can be utilized for heating the amplification medium 11. Therefore, the power consumption of the optical direct amplifier 10 can be lowered.

One end of an optical fiber 18 is connected to the output port of the semiconductor laser 19. The laser 19 is supplied with a predetermined driving current to cause laser oscillation and as a result, a predetermined laser light for excitation is emitted from the output port of the laser 19. The laser light for excitation thus outputted is sent to the amplification medium 11 through the optical fiber 18.

Figure 3:
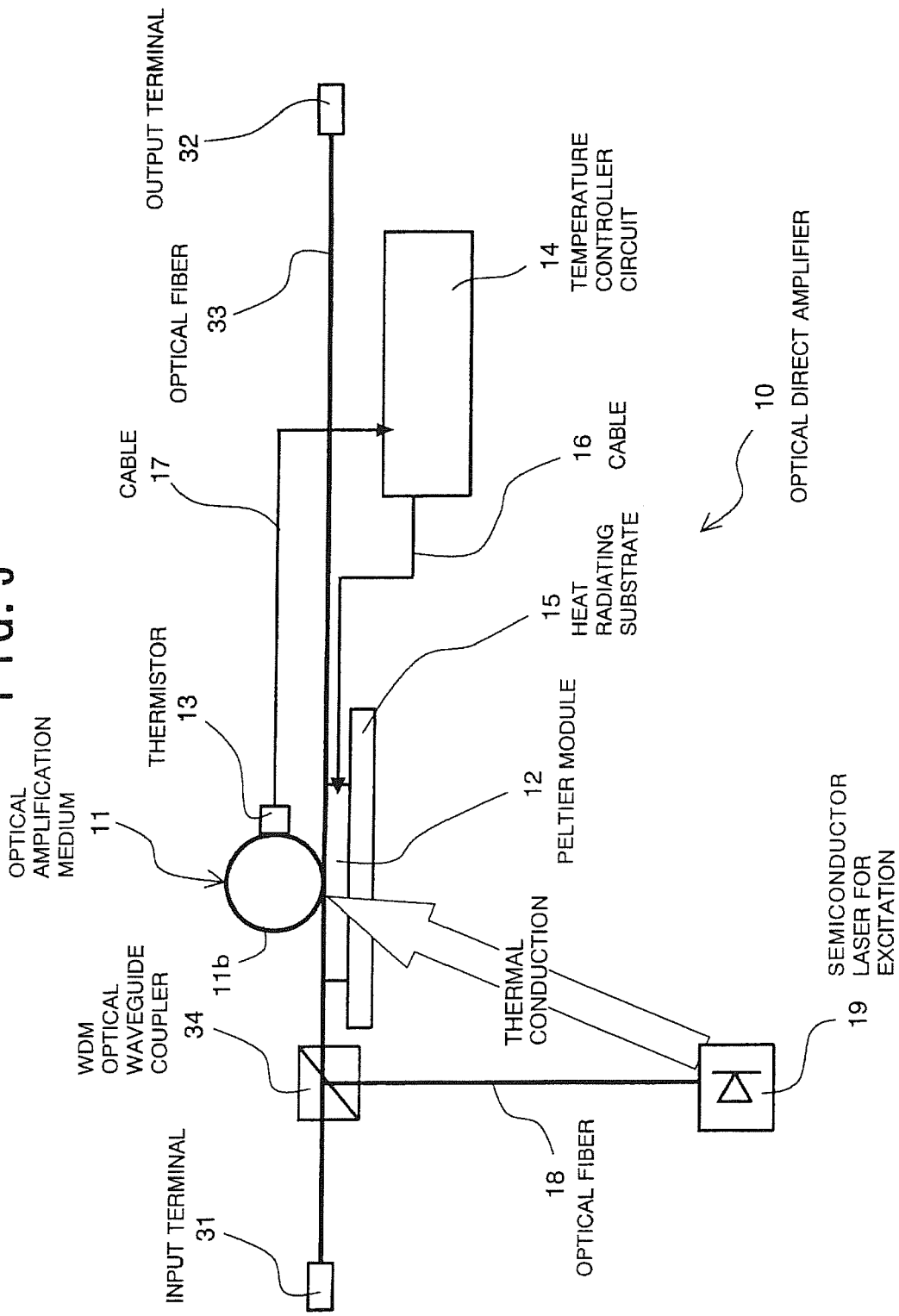
FIG. 3 is an explanatory view showing schematically the entire structure of the optical direct amplifier according to the first embodiment of the invention, where the said amplifier is used in a WDM optical transmission system using optical repeaters.

When the optical direct amplifier 10 having the above-described structure is applied to a WDM optical transmission system using optical repeaters, the amplifier 10 has the overall structure shown in FIG. 3.

The optical direct amplifier 10 comprises optical fiber 33 for signal light transmission. A WDM optical waveguide coupler 34 is mounted between the input terminal 31 and the output terminal 32 of the optical fiber 33. One end of the optical fiber 18, through which the output light (i.e., the excitation light) of the semiconductor laser 19 is sent to the outside of the said fiber 18, is optically connected to the WDM optical waveguide coupler 34. The optical fiber 11b of the amplification medium 11 is optically connected to the optical fiber 33.

The WDM optical waveguide coupler 34 couples the signal light sent into the optical fiber 33 through the input terminal 31 with the excitation light emitted from the semiconductor laser 19 and at the same time, wavelength division-multiplexes the signal light and the excitation light thus coupled. The wavelength division-multiplexed signal and excitation lights generated in this way are transmitted through the optical fiber 33 toward the output terminal 33. During this transmission, the wavelength division-multiplexed excitation light enters the optical fiber 11b of the amplification medium 11 and excites the same fiber 11b, thereby causing a predetermined optical amplification operation in the said fiber 11b. Due to the said optical amplification operation, the waveform of the division-multiplexed signal light propagating in the optical fiber 33 is amplified and thereafter, the division-multiplexed signal light thus amplified is emitted from the output terminal 32.

With the optical direct amplifier 10 according to the first embodiment of the invention, as explained above, the heat generated by the semiconductor laser 19, which is used for optically exciting the optical amplification medium 11 (i.e., the optical fiber 11b for amplification), is conveyed to the heat radiating substrate 15 and thereafter, it is dissipated or radiated to the outside of the optical direct amplifier 10. Moreover, the Peltier module 12 that allows the heat to flow into the amplification medium 11 from the laser 19 and that prevents the heat from flowing into the laser 19 from the amplification medium 11 is provided between the amplification medium 11 and the heat radiating substrate 15. Thus, the amplification medium 11 is heated by application of the heat generated by the laser 19 (the said heat was thrown away in the atmosphere in the past) by way of the heat radiating substrate 15 and the Peltier module 12.

Therefore, the temperature of the amplification medium 11 can be raised utilizing the heat generated by the laser 19 to thereby maintain the amplification medium 11 at the predetermined temperature higher than the ambient temperature. As a result, the electric power required for heating the amplification medium 11 can be made unnecessary and thus, the power consumption of the optical direct amplifier 10 of the first embodiment can be lowered accordingly.

Moreover, it is sufficient for the amplifier 10 to provide the heat radiating substrate 15 and the Peltier module 12 in addition to the amplification medium 111, the semiconductor laser (not shown in FIG. 1), and the temperature controller circuit 114 that are included in the prior-art optical direct amplifier 110. Furthermore, the heat radiating substrate 15 can be easily realized with a rigid member having a good thermal conductivity, and the Peltier module 12 can be easily realized by a known thermoelectric effect element. This means that the structure of the optical direct amplifier 10 according to the first embodiment is simplified and realized at a low cost.

Second Embodiment

Figure 4:
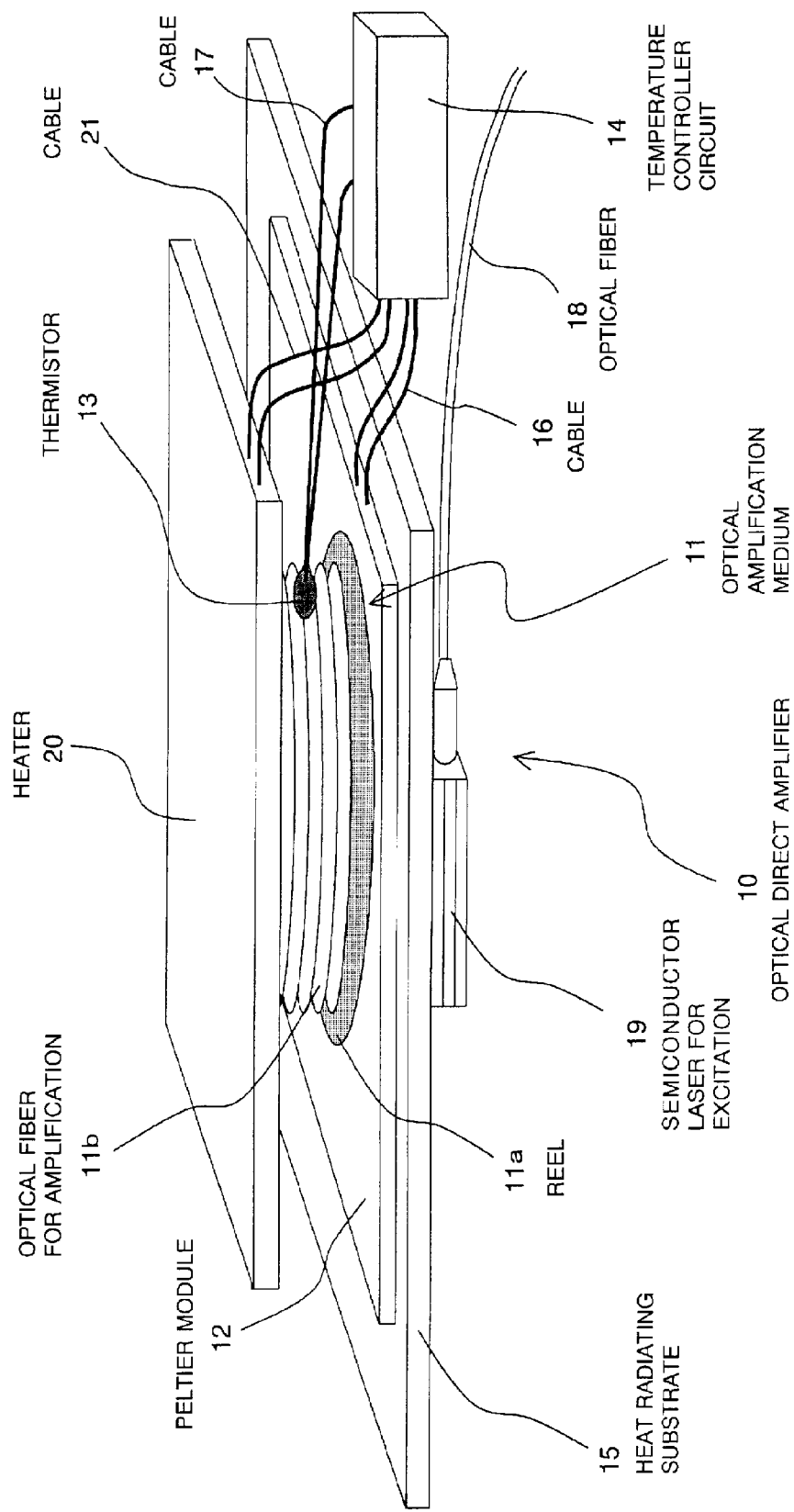
FIG. 4 is a perspective view showing schematically the structure of an optical direct amplifier according to a second embodiment of the invention.

An optical direct amplifier 10A according to a second embodiment of the invention has the structure as shown in FIG. 4.

The structure of the amplifier 10A according to the second embodiment is the same as that of the above-described optical direct amplifier 10 according to the first embodiment except that a heater 20 is additionally mounted on the surface of the reel 11a of the amplification medium 11 opposite to the Peltier module 12. In other words, the structure of the amplifier 10A corresponds to the combination of the structure of the amplifier 10 and the heater 20. Therefore, the explanation about the same structure is omitted here by attaching the same reference numerals as those used in the first embodiment of FIG. 2.

The heater 20 is an electrical heater that generates heat responsive to the supply of electric power. Here, the shape of the heater 20 is rectangular plate- or sheet-shaped. This shape was determined in consideration of the thermal conductivity to the real 11a of the optical amplification medium 11 and the space saving. The heater 20 is electrically connected to the temperature controller circuit 14 by way of cables 21. Due to the operation of the temperature controller circuit 14, the heater 20 can be operated or activated to generate heat as necessary. The heat thus generated from the heater 20 is applied to the amplification medium 11 along with the heat generated by the semiconductor laser 19 as necessary.

With the optical direct amplifier 10A according to the second embodiment, because of the above-described structure, there is an additional advantage that the amplifier 10A can be used even if it is difficult to maintain the amplification medium 11 at the predetermined chosen temperature higher than the ambient temperature utilizing the heat generated by the semiconductor laser 19 due to such a reason as the ambient temperature being extremely low, in addition to the advantages of the amplifier 10 of the first embodiment.

Since the amplifier 10A of the second embodiment comprises the heater 20, the power consumption will be larger than that of the amplifier 10 of the first embodiment, if the heater 20 is operated. However, the heat generated by the laser 19 is mainly utilized for heating the amplification medium 11. Therefore, the power consumption of the amplifier 10A is lower than that of the prior-art amplifier 110 described previously.

Other Embodiments

The above-described first and second embodiments are preferred examples of the present invention. Therefore, needless to say, the present invention is not limited to these embodiments, and any modification is applicable to them.

For example, the thermistor 13 is used as the temperature sensor in the first and second embodiments; however, any other type of temperature sensor may be used for this purpose.

Although the optical amplification medium 11 where the optical fiber 11b for amplification is placed around the reel 11a is used in the first and second embodiments, the invention is not limited to this. The amplification medium 11 may have any other structure, such as the structure including a broad (i.e., sheet-shaped) optical fiber for amplification placed around the reel 11a, or the structure including only an optical fiber for amplification without the reel 11b. Instead of an optical fiber or fibers for amplification, any other type of optical amplification medium may be used.

The semiconductor laser 19 is used as the excitation light source for the optical amplification medium 11 in the above embodiments. However, the invention is not limited to a semiconductor laser. Any other type of excitation light source may be used.

As the temperature controller circuit 14, a temperature controller circuit having any structure may be used if it is usable along with the optical direct amplifier of the type according to the present invention.

The semiconductor laser 19 is fixed on one surface of the heat radiating substrate 15 in the above embodiments. However, the invention is not limited to this. If the heat generated by the laser 19 can be transmitted to the substrate 15, the laser 19 may be mounted to be apart from the substrate 15 using, for example, an appropriate heat transfer member that intervenes between the laser 19 and the substrate 15.

In the above second embodiment, the sheet-shaped electrical heater 20 is used. However, any other type of heater may be used if it can heat the optical amplification medium 11.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An optical fiber amplifier comprising:
   an exciting light source for emitting excitation light;
   an optical amplification medium configured to optically amplify signal light in response to the excitation light emitted by the exciting light source, the optical amplification medium including an optical fiber;
   a coupler configured to couple the excitation light emitted from the excitation light source to the optical amplification medium; and,
   a heat transmitter, provided between the optical amplification medium and the exciting light source, to allow heat to flow into the optical amplification medium from the exciting light source.

2. The amplifier of claim 1, wherein a Peltier element is used as the heat transmitter.

3. The amplifier of claim 2, further comprising a temperature controller configured to control a temperature of the optical amplification medium using the Peltier element.

4. The amplifier of claim 2, wherein the Peltier element is plate-shaped.

5. The amplifier of claim 1, wherein the optical amplification medium is located on a first side of the heat transmitter, and the exciting light source is located on a second side of the heat transmitter opposite the first side.

6. The amplifier of claim 5, wherein the temperature controller is configured to maintain the temperature of the optical amplification medium at a temperature higher than an ambient temperature.

7. The amplifier of claim 1, further comprising a heat radiating member configured to radiate heat generated from the exciting light source,
   wherein the heat radiating member is located between the heat transmitter and the exciting light source.

8. The amplifier of claim 1, further comprising a heater configured to heat the optical amplification medium.

* * * * *